(12) United States Patent
Seo et al.

(10) Patent No.: US 8,120,976 B2
(45) Date of Patent: Feb. 21, 2012

(54) LINE DEFECT DETECTION CIRCUIT FOR DETECTING WEAK LINE

(75) Inventors: Eunsung Seo, Seoul (KR); Kye-hyun Kyung, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1032 days.

(21) Appl. No.: 11/826,311

(22) Filed: Jul. 13, 2007

(65) Prior Publication Data
US 2008/0049523 A1 Feb. 28, 2008

(30) Foreign Application Priority Data
Aug. 28, 2006 (KR) .................. 10-2006-0081837
Feb. 27, 2007 (KR) .................. 10-2007-0019921

(51) Int. Cl.
*G11C 29/00* (2006.01)
(52) U.S. Cl. .................... 365/201; 365/189.07
(58) Field of Classification Search .............. 365/201, 365/189.07, 210.1, 210.11, 210.12, 214
See application file for complete search history.

(56) References Cited

U.S. PATENT DOCUMENTS

| | | | |
|---|---|---|---|
| 6,392,939 B1 * | 5/2002 | Hikiyama et al. | 365/201 |
| 6,414,890 B2 * | 7/2002 | Arimoto et al. | 365/201 |
| 6,501,691 B2 | 12/2002 | Kawamoto et al. | |
| 6,747,910 B2 | 6/2004 | Tsuji | |
| 7,132,846 B2 | 11/2006 | Kim et al. | |
| 7,474,573 B2 * | 1/2009 | Shin | 365/201 |
| 2001/0009525 A1 * | 7/2001 | Kawamoto et al. | 365/201 |

FOREIGN PATENT DOCUMENTS

| | | |
|---|---|---|
| JP | 2001-210098 | 8/2001 |
| KR | 100272663 B1 | 8/2000 |
| KR | 10-2003-0066438 A | 8/2003 |
| KR | 10-2004-0095049 A | 11/2004 |

* cited by examiner

*Primary Examiner* — Richard Elms
*Assistant Examiner* — Hien N Nguyen
(74) *Attorney, Agent, or Firm* — Lee & Morse, P.C.

(57) ABSTRACT

Example embodiments relate to a line defect detection circuit, including a first driver disposed at one end of a line and configured to drive the line using a first voltage or a second voltage in response to a control signal, and a second driver disposed at the other end of the line and configured to drive the line using the second voltage in response to a stress signal.

17 Claims, 5 Drawing Sheets

LINE DEFECT DETECTION CIRCUIT FOR DETECTING WEAK LINE

BACKGROUND OF THE INVENTION

1. Field of the Invention

Example embodiments relate to a semiconductor device. More particularly, to a semiconductor device having a circuit for detecting a weak line.

2. Description of the Related Art

As semiconductor devices become more highly integrated, widths of lines and intervals between the lines may decrease. The lines may be arranged on a patterned memory, e.g., a memory cell array, and any defect of the lines may cause a failure of the semiconductor device. Failures of the semiconductor devices may be arranged in chronological order. For example, the failures may be classified as an initial failure, an accidental failure, and a wear-out failure. The initial failure may occur during a manufacturing process, and may be detected during the testing of the semiconductor devices. The accidental failure may occur during use of the semiconductor devices, and the wear-out failure may occur after an extended period of use of the semiconductor devices.

In order to provide reliable semiconductor devices, a burn-in test may be employed, which may accelerate operations of the semiconductor devices for a predetermined time in order to wear out the semiconductor devices and then detect failures of the semiconductor devices in early stage of manufacturing. The burn-in test may subject the semiconductor devices to high temperature and high pressure so as to prematurely induce the wear-out failures. Accordingly, testing methods for detecting defects in the lines may be needed to prevent and/or reduce failures in the semiconductor device.

SUMMARY OF THE INVENTION

Example embodiments are therefore directed to a semiconductor device, which substantially overcomes one or more of the problems due to the limitations and disadvantages of the related art.

It is therefore a feature of an example embodiment to provide a semiconductor device having a line defect detection circuit which may increase a stress application effect to find a weak line.

At least one of the above and other features of example embodiments may be to provide a line defect detection circuit. The line defect detection circuit may include a first driver disposed at one end of a line and configured to drive the line using a first voltage or a second voltage in response to a control signal, and a second driver disposed at the other end of the line and configured to drive the line using the second voltage in response to a stress signal.

The first driver may include a PMOS transistor in which the control signal may be connected to a gate, the first voltage may be connected to a source, and one end of the line is connected to a drain, and an NMOS transistor in which the control signal is connected to a gate, the second voltage is connected to the source, and one end of the line is connected to a drain.

The second driver may include an NMOS transistor in which the stress signal may be connected to a gate, the second voltage may be connected to the source, and the other end of the line may be connected to a drain.

The control signal and the stress signal may be provided in a burn-in test mode.

The line defect detection circuit may also include a first conductive layer and a second conductive layer connected through contacts or via holes.

The line defect detection circuit may also include lines that exist on a memory cell array pattern. Further, the lines may be a bit line of the memory cell array.

The first voltage may be a power supply voltage and the second voltage may be a ground voltage.

The second driver may drive the line using a third voltage in response to the stress signal. The second driver may include a PMOS transistor in which the stress signal may be connected to a gate, the third voltage may be connected to the source, and the other end of the line may be connected to a drain.

The first voltage may be a boost voltage higher than a power supply voltage. The second voltage may be the ground voltage, and the third voltage may be the power supply voltage.

At least one of the above and other features of example embodiments may be to provide a line defect detection circuit. The line defect detection circuit may include first drivers disposed on one end of a plurality of lines and configured to drive corresponding lines using a first voltage or a second voltage in response to a plurality of control signals, and second drivers disposed on the other end of each line and configured to drive the corresponding lines using the second voltage to a ground voltage in response to a stress signal.

BRIEF DESCRIPTION OF THE DRAWINGS

The above and other features and advantages of the example embodiments will become more apparent to those of ordinary skill in the art by describing in detail example embodiments thereof with reference to the attached drawings, in which.

DETAILED DESCRIPTION OF THE INVENTION

Korean Patent Application Nos. 10-2006-0081837, filed on Aug. 28, 2006, and 10-2007-0019921, filed on Feb. 27, 2007, in the Korean Intellectual Property Office, and entitled: "Line Defect Detection Circuit for Detecting Weak Line," is incorporated by reference herein in its entirety.

Example embodiments will now be described more fully hereinafter with reference to the accompanying drawings. Example embodiments may, however, be embodied in different forms and should not be construed as limited to the embodiments set forth herein. Rather, these example embodiments are provided so that this disclosure will be thorough and complete, and will fully convey the scope of the invention to those skilled in the art.

Figure 1:
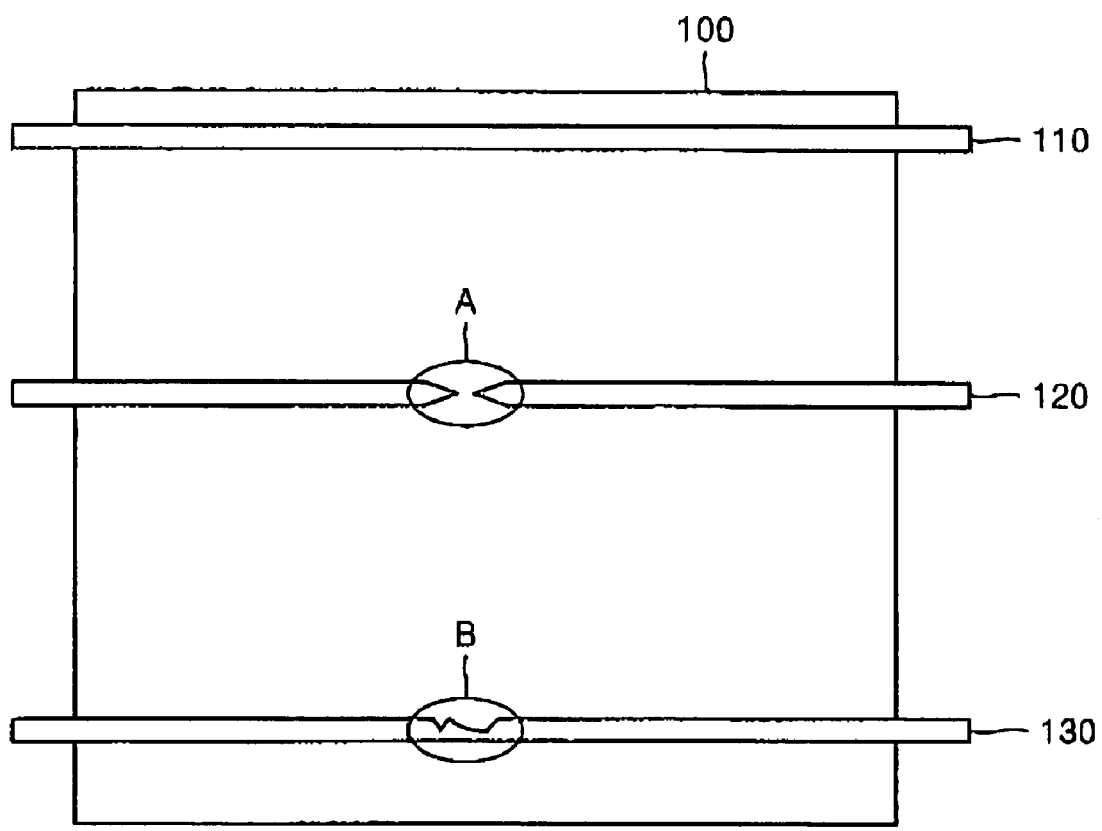
FIG. 1 illustrates a diagram of line defects.

FIG. 1 illustrates a diagram of line defects. Referring to FIG. 1, a plurality of first, second and third lines 110, 120, and 130, may be arranged on a patterned memory 100, e.g., a memory cell array. The first line 110 may have a regular width, and thus, no defect may be detected. The second line 120 may have an open circuit (A), and thus, a defect may be detected as an initial failure. The third line 130 may have a width that may be a non-uniform portion (B). Although the third line 130 may not be detected as an initial failure, the third line 130 may still cause an accidental failure and/or a wear-out failure at a later time. Accordingly, due to the potential defects in the second line 120 and third line 130, the semiconductor device may not be reliable, and thereby, cause failures and errors.

In order to solve the above problems, example embodiments provide a line defect detection circuit that may increase a stress effect by transmitting a strong current to lines for a short period of time, in a wafer burn-in test mode and/or a package burn-in test mode. Further, because the line defect detection circuit may be used to find defects in the lines by sequentially applying control signals, a weak line may also be easily detected. Further, the line defect detection circuit may provide an early detection of defects in contacts or via holes of a line, which may be connected using a metal jumper.

Figure 2:
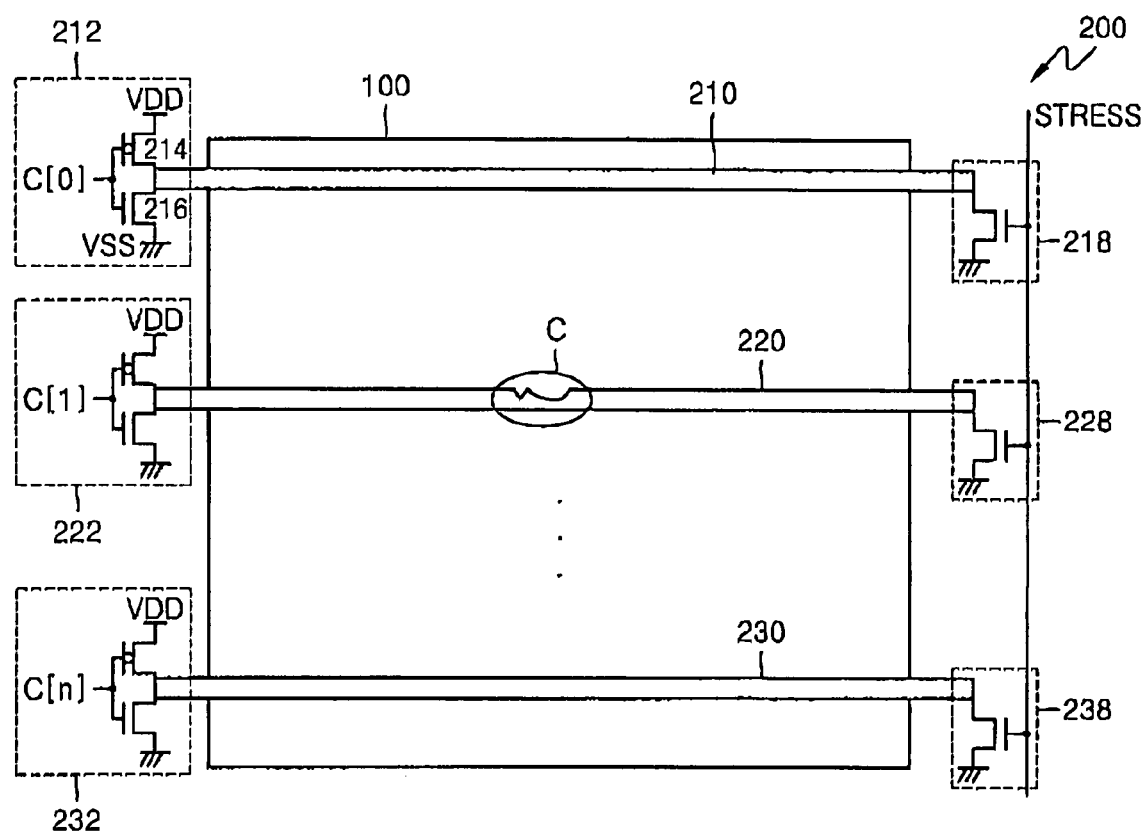
FIG. 2 illustrates a diagram of a line defect detection circuit according to an example embodiment.

FIG. 2 illustrates a diagram of a line defect detection circuit 200 according to an example embodiment. Referring to FIG. 2, a plurality of first, second . . . and $n+1^{th}$ lines 210, 220 and 230 may be disposed on a patterned memory 100 such as a memory cell array. The first, second, . . . and $n^{th}+1$ lines 210, 220 and 230 may be lines that serve as a word line and/or a bit line of the patterned memory 100. In the line defect detecting circuit 200, the first, second, . . . and $n^{th}+1$ lines 210, 220 and 230 may be respectively connected between first drivers 212, 222 and 232, and second drivers 218, 228 and 238. The first drivers 212, 222 and 223, and the second drivers 218, 228 and 238 may be disposed at ends of the first, second, . . . and $n^{th+1}$ lines 210, 220 and 230, respectively. It should be appreciated that the drivers may be arranged in other configurations.

The first drivers 212, 222 and 232 may be column selection line drivers and/or word line drivers. In an example embodiment, the first drivers 212, 222 and 232 may be column selection line drivers, and the lines 210, 220 and 230 may be column selection lines. The column selection line driver may selectively connect a predetermined bit line in a memory cell array to a bit line sense amplifier in response to a column selection signal.

The first driver 212 may drive the first line 210 in response to a first control signal C[0], and may include a first PMOS transistor 214 and a first NMOS transistor 216. In the first PMOS transistor 214, a power supply voltage VDD may be connected to a source, the first control signal C[0] may be connected to a gate, and the first line 210 may be connected to a drain. In the first NMOS transistor 216, the first line 210 may be connected to a drain, the first control signal C[0] may be connected to a gate, and a ground voltage VSS may be connected to a source. The second driver 218 may be connected between the first line 210 and the ground voltage VSS, and may include an NMOS transistor in which a stress signal STRESS may be applied to a gate.

The remaining first drivers 222 and 232, respectively, may drive the second and $n^{th}+1$ lines 220 and 230 in response to a second and n control signals C[1] and C[n]. The first, second, . . . and n control signals C[0], C[1], . . . and C[n] may correspond to the column selection signals.

When the line defect detection circuit 200 is in a test mode, i.e., a burn-in test mode, the first, second, . . . and n control signals C[0], C[1], . . . and C[n] may be sequentially provided in a logic low, and the stress signal STRESS may be provided in a logic high. In the first, second, . . . and $n^{th}+1$ lines 210, 220 and 230, current paths from the power supply voltage VDD of the first drivers 212, 222, and 232 to the ground voltage VSS of the second drivers 218, 228, and 238 may be sequentially formed. A strong current may be transmitted to the first, second, . . . and $n^{th}+1$ lines 210, 220 and 230 for a short period of time so as to produce a strong stress effect. Accordingly, a line with a weak part (C), e.g., the second line 220, may be opened due to the strong current, and thus, may be detected as a defective line. Further, because the line defect detection circuit 200 may sequentially detect defects in the first, second, . . . and $n^{th}+1$ lines 210, 220 and 230, defective lines may be easily detected.

Figure 3:
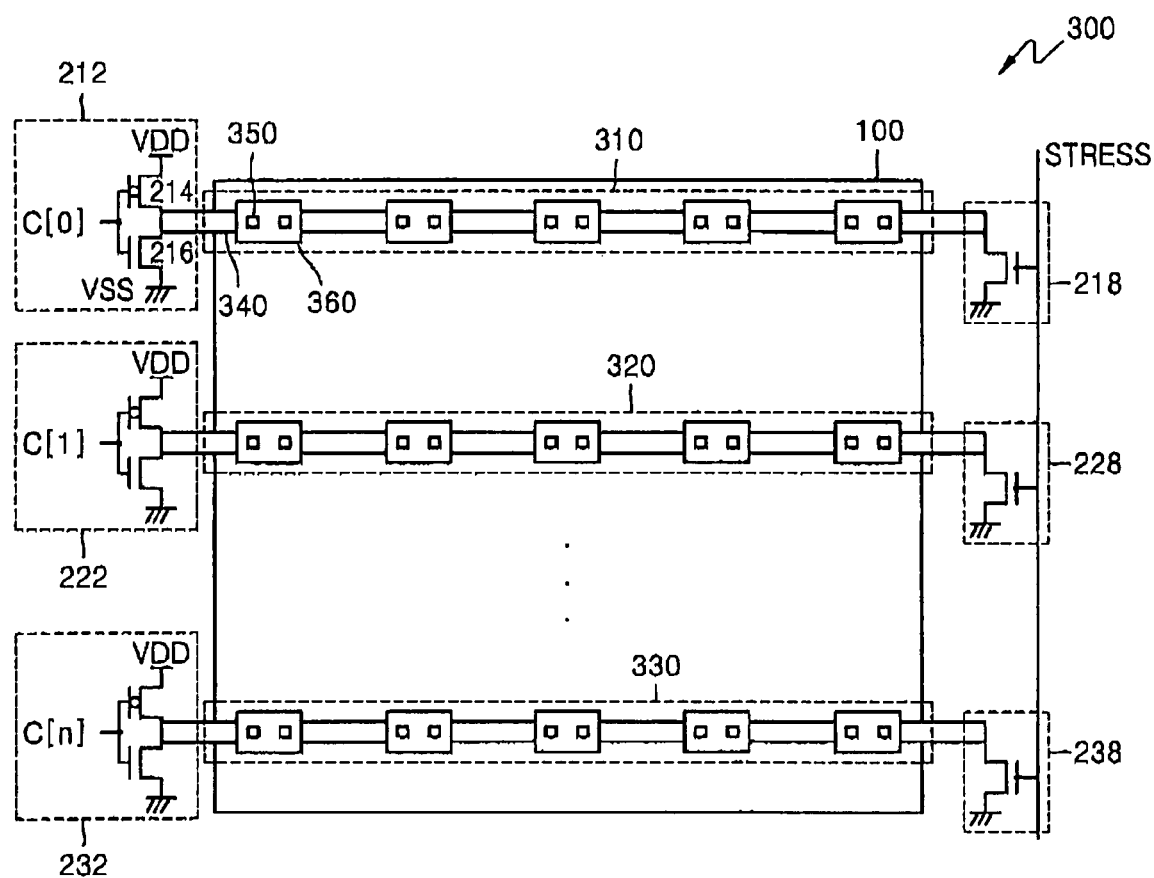
FIG. 3 illustrates a diagram of a line defect detection circuit according to another example embodiment.

FIG. 3 illustrates a diagram of a line defect detection circuit 300 according to another example embodiment. The line defect detection circuit 300 may have the same reference numerals as the line defect detection circuit 200 of FIG. 2, and thus, may have the same elements and/or functions. Accordingly, descriptions of similar elements will be omitted in order to avoid repetition.

The line defect detection circuit 300 may be used to provide an early detection of defects in contacts or via holes 350 of a line connected using metal jumpers. Referring to FIG. 3, in comparison with the line defect detection circuit 200 of FIG. 2, the line defect detection circuit 300 may include a lower conductive layer 340 and an upper conductive layer 360 of first, second, . . . and $n^{th}+1$ lines 310, 320, and 330 connected through the contacts or via holes 350. The lower conductive layer 340 may be a first metal layer, and the upper conductive layer 360 may be a second metal layer formed above the first metal layer. Alternatively, the lower conductive layer 340 may be the lowest metal layer and the upper conductive layer 360 may be the top metal layer. The lowest metal layer and the top metal layer may be laminated with contacts or via holes 350 for interconnection with a plurality of metal layers between the top metal layer and the lowest metal layer.

When the line defect detection circuit 300 is in a test mode, the first, second, . . . and n control signals C[0], C[1], . . . and C[n] may be sequentially provided in a logic low, and the stress signal STRESS may be provided in a logic high. Accordingly, current paths from the power supply voltage VDD of the first drivers 212, 222 and 232 to the ground voltage VSS of the second drivers 218, 228 and 238 may be sequentially formed in the first, second, . . . and $n^{th}+1$ lines 310, 320 and 330. A strong current may pass through the first, second, . . . and $n^{th}+1$ lines 310, 320 and 330 for a short period of time, so as to produce a strong stress effect. Accordingly, the contacts or via holes 350 having defects may be damaged by the strong current. As a result, the first, second, . . . and $n^{th}+1$ lines 310, 320 and 330 may be opened, and thus, detected as being defective.

Figure 4:
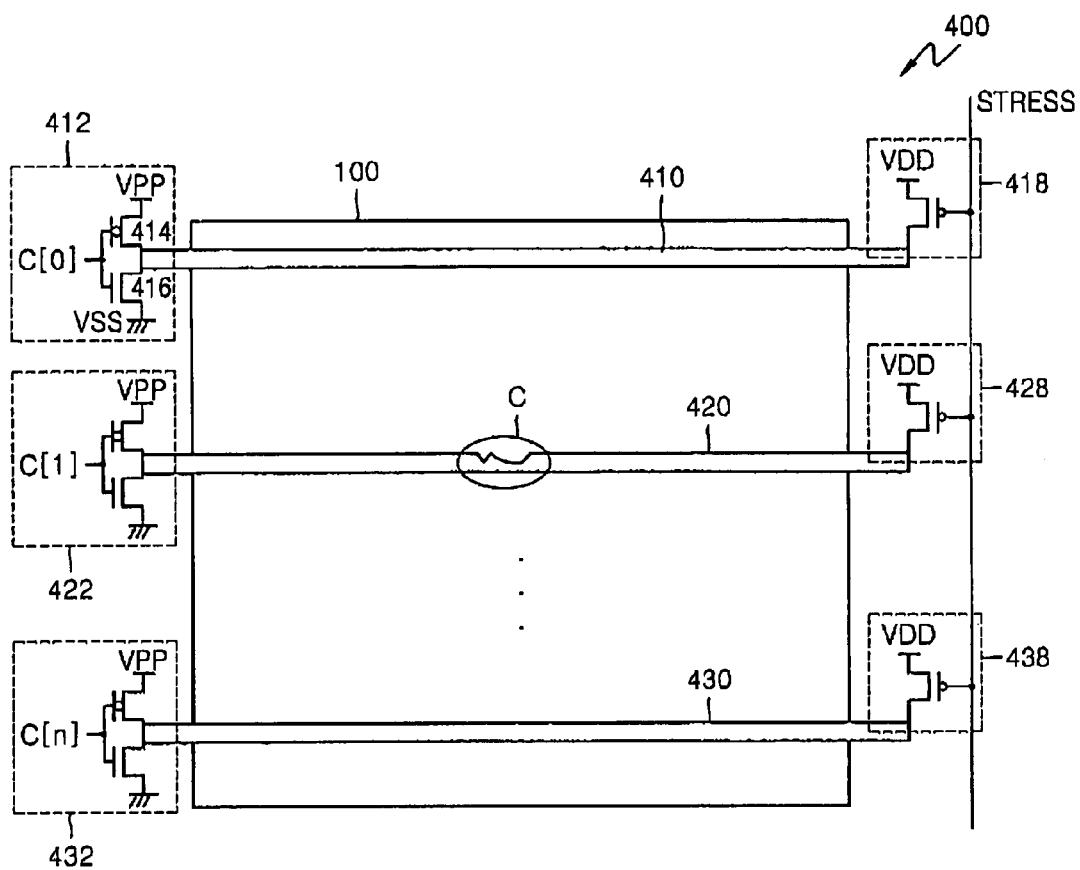
FIG. 4 illustrates a diagram illustrating a line defect detection circuit according to another example embodiment.

FIG. 4 illustrates a diagram of a line defect detection circuit 400 according to another example embodiment. Referring to FIG. 4, first, second, . . . and $n^{th}+1$ lines 410, 420 and 430 may be respectively connected between first drivers 412, 422 and 432, and second drivers 418, 428 and 438. In an example embodiment, the first drivers 412, 422, 432 may be word line drivers, and the first, second, . . . and $n^{th}+1$ lines 410, 420 and 430 may also be word lines. It should be appreciated that the first, second, . . . and $n^{th}+1$ lines 410, 420 and 430 may also act as a bit line.

The first driver 412 may drive the first line 410 in response to a first control signal C[0], and may include a first PMOS transistor 414 and a first NMOS transistor 416. In the first PMOS transistor 414, a boost voltage VPP may be connected to a source, the first control signal C[0] may be connected to a gate, and the first line 410 may be connected to a drain. In the first NMOS transistor 416, the first line 410 may be connected to a drain, the first control signal C[0] may be connected to a gate, and a ground voltage VSS may be connected to a source. The second driver 418 may be connected between the first line 410 and a power supply voltage VDD, and may include a PMOS transistor, in which a stress signal STRESS may be applied to the gate.

The remaining first drivers 422 and 432 respectively may drive the second and $n^{th}+1$ lines 420 and 430 in response to a second and n control signals C[1] and C[n]. The first, second, . . . and $n^{th}+1$ control signals C[0], C[1], . . . and C[n] may correspond to word line drive signals.

When the line defect detection circuit 400 is in a test mode, e.g., a package burn-in test mode, the first, second, . . . and n control signals C[0], C[1], . . . and C[n] may be sequentially provided in a logic low, and the stress signal STRESS may be provided in a logic high. Further, in the first, second, . . . and $n^{th}+1$ lines 410, 420 and 430, current paths may be sequentially formed from the power supply voltage VDD of the second drivers 418, 428, and 438 to the ground voltage VSS of the first drivers 212, 222, and 232. A strong current may be transmitted to the first, second, . . . and $n^{th}+1$ lines 410, 420 and 430 for a short period of time, so as to produce strong stress effect. As a result, a line with a weak part (C), e.g., the second line 420, may be opened due to the strong current. Due to the open structure, the second line 420 may be detected as a defective line. Moreover, because the line defect detection circuit 400 may sequentially detect defects in the first, second, . . . and $n^{th}+1$ lines 410, 420 and 430, defective lines may be easily detected. Further, a level of the boost voltage VPP may be stable because a current path connected to the boost voltage VPP may not be formed in a package burn-in test mode.

When the line defect detection circuit 400 is in a wafer burn-in test mode, the first, second, . . . and n control signals C[0], C[1], . . . and C[n] may also be sequentially provided in logic low, and the stress signal STRESS may also be provided in logic low. In the first, second, . . . and $n^{th}+1$ lines 410, 420 and 430, current paths may be sequentially formed from the boost voltage VPP of the first drivers 412, 422 and 432 to the power supply voltage VDD of the second drivers 418, 428 and 438. Accordingly, the line 420 having a weak part (C), e.g., the second line 420, may be opened due to the strong current, which may be detected as a defective line. Further, a level of the boost voltage VPP may be stable (even when a current path connected to the boost voltage VPP is formed) because the boost voltage VPP may be externally applied through a pad in a wafer burn-in test mode.

Figure 5:
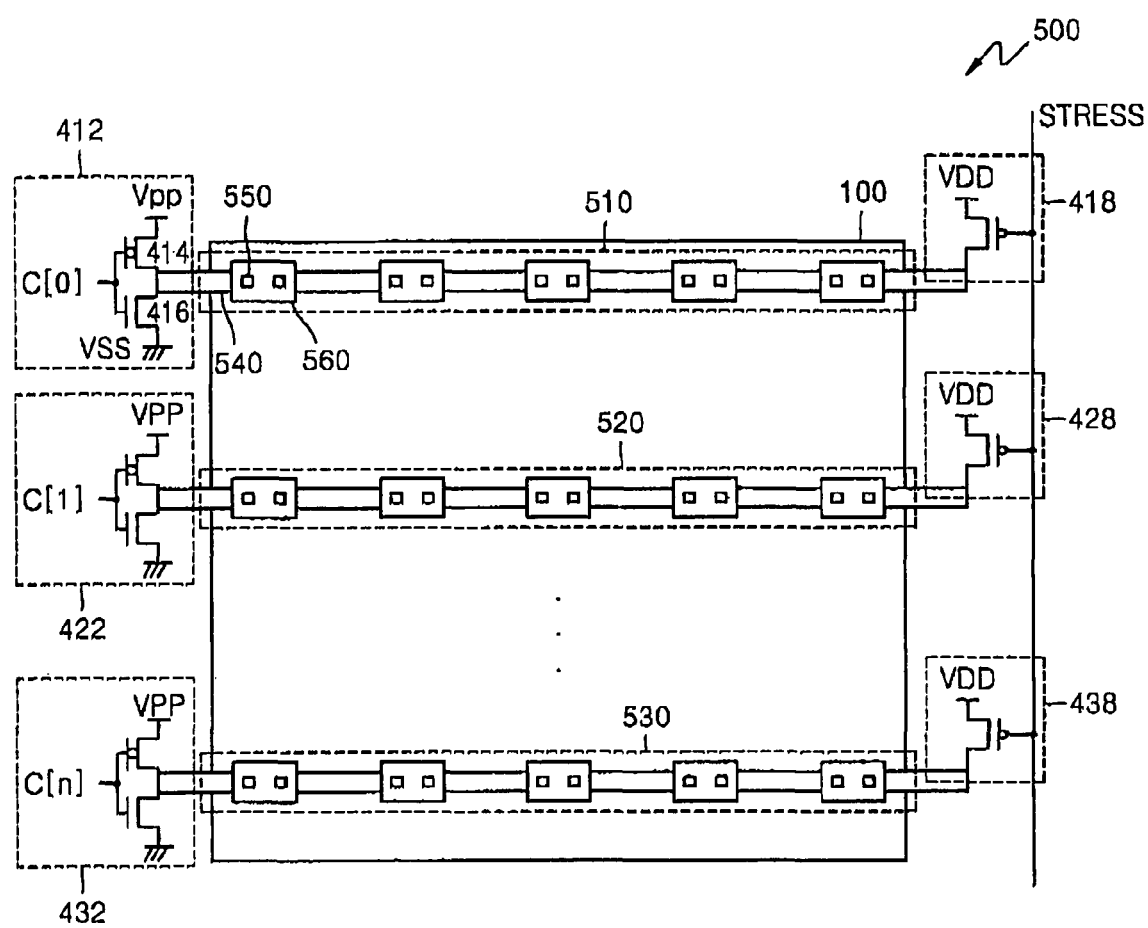
FIG. 5 illustrates a diagram of a line defect detection circuit according to another example embodiment.

FIG. 5 illustrates a diagram of a line defect detection circuit 500 according to another example embodiment. The line defect detection circuit 500 may have the same reference numerals as the line defect detection circuit 400 of FIG. 4, and thus, may include the same elements and/or functions. Accordingly, descriptions of similar elements will be omitted in order to avoid repetition.

Referring to FIG. 5, in comparison with the line defect detection circuit 400 of FIG. 4, the line defect detection circuit 500 may include a lower conductive layer 540 and an upper conductive layer 560 of first, second, . . . and $n^{th}+1$ lines 510, 520 and 530, which may be connected through the contacts or via holes 350.

The lower conductive layer 540 may be a first metal layer and the upper conductive layer 560 may be a second metal layer formed above the first metal layer. Alternatively, the lower conductive layer 540 may be the lowest metal layer and the upper conductive layer 560 may be the top metal layer. The lowest metal layer and the top metal layer may be laminated with contacts or via holes 550 for interconnection with a plurality of metal layers between the top metal layer and the lowest metal layer.

When the line defect detection circuit 500 is in a test mode, the first, second, . . . and n control signals C[0], C[1], . . . and C[n] maybe sequentially provided in a logic high, and the stress signal STRESS may be provided in a logic low. Accordingly, current paths from the power supply voltage VDD of the second drivers 418, 428, and 438 to the ground voltage VSS of the first drivers 412, 422, and 432 may be sequentially formed in the first, second, . . . and $n^{th}+1$ lines 510, 520 and 530. A strong current may pass through the first, second, . . . and $n^{th}+1$ lines 510, 520 and 530 for a short period of time so as to produce a strong stress effect. Accordingly, the contacts or via holes 550 having the defects may be damaged by the strong current, and thus, the first, second, . . . and $n^{th}+1$ lines 510, 520 and 530 may be opened to be detected as defective.

Although the above example embodiments illustrated only one line having a defect in the line defect detection circuit, it should be appreciated that more than one lines may include a defect in the line defect detection circuit.

It will be understood that, although the terms "first", "second" and etc. may be used herein to describe various elements, structures, components, regions, layers and/or sections, these elements, structures, components, regions, layers and/or sections should not be limited by these terms. These terms are only used to distinguish one element, structure, component, region, layer and/or section from another element, structure, component, region, layer and/or section. Thus, a first element, structure, component, region, layer or section discussed below could be termed a second element, structure, component, region, layer or section without departing from the teachings of the example embodiments.

Spatially relative terms, such as "beneath," "below," "lower," "above," "upper" and the like, may be used herein for ease of description to describe one element or feature relationship to another element(s) or feature(s) as illustrated in the figures. It will be understood that the spatially relative terms are intended to encompass different orientations of the device in use or operation in addition to the orientation depicted in the figures. For example, if the device in the figures is turned over (or upside down), elements or layers described as "below" or "beneath" other elements or layers would then be oriented "above" the other elements or layers. Thus, the exemplary term "below" can encompass both an orientation of above and below. The device may be otherwise oriented (rotated 90 degrees or at other orientations) and the spatially relative descriptors used herein interpreted accordingly.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A line defect detection circuit, comprising:
 a first driver disposed at one terminal end of a line and configured to drive the line using a first voltage or a second voltage in response to a control signal, wherein the first driver includes a PMOS transistor in which the control signal is connected to a gate, the first voltage is connected to a source, and one end of the line is connected to a drain, and an NMOS transistor in which the control signal is connected to a gate, the second voltage is connected to the source, and one end of the line is connected to a drain; and a second driver disposed at the other terminal end of the line and configured to drive the line using a third voltage in response to a stress signal, wherein the second driver includes a PMOS transistor or an NMOS transistor in which the stress signal is connected to a gate, the third voltage is connected to the source, and the other end of the line is connected to a drain.

2. The line defect detection circuit as claimed in claim 1, wherein the control signal and the stress signal are provided in a burn-in test mode.

3. The line defect detection circuit as claimed in claim 1, wherein a first conductive layer and a second conductive layer of the line are connected through contacts or via holes.

4. The line defect detection circuit as claimed in claim 1, wherein the line exists on a memory cell array pattern.

5. The line defect detection circuit as claimed in claim 4, wherein the line is a bit line of the memory cell array.

6. The line defect detection circuit as claimed in claim 4, wherein the first voltage is a power supply voltage and the second voltage is a ground voltage.

7. The line defect detection circuit as claimed in claim 1, wherein the second driver drives the line using a third voltage in response to the stress signal.

8. The line defect detection circuit as claimed in claim 7, wherein the first voltage is a boost voltage higher than a power supply voltage, the second voltage is the ground voltage, and the third voltage is the power supply voltage.

9. A line defect detection circuit, comprising:
a plurality of first drivers disposed on one terminal end of a plurality of lines, and each plurality of first drivers being configured to drive corresponding lines using a first voltage or a second voltage in response to a plurality of control signals, wherein each of the first drivers includes a PMOS transistor in which the control signal corresponding to each line is connected to a gate, the first voltage is connected to a source, and one end of the corresponding line is connected to a drain, and an NMOS transistor in which the corresponding control signal is connected to a gate, the second voltage is connected to a source, and one end of the corresponding line is connected to a drain; and
a plurality of second drivers disposed on the other terminal end of each line, and each plurality of second drivers being configured to drive the corresponding lines using a third voltage to a ground voltage in response to a stress signal, wherein each of the second drivers includes a PMOS transistor or an NMOS transistor in which the stress signal is connected to a gate, the third voltage is connected to a source, and the other end of the corresponding line is connected to a drain.

10. The line defect detection circuit as claimed in claim 9, wherein the control signals and the stress signal are provided in a burn-in test mode.

11. The line defect detection circuit as claimed in claim 9, wherein first conductive layer and a second conductive layer of each of the lines are connected through contacts or via holes.

12. The line defect detection circuit as claimed in claim 9, wherein the lines exist on a memory cell array pattern.

13. The line defect detection circuit as claimed in claim 9, wherein the lines are bit lines of the memory cell array.

14. The line defect detection circuit as claimed in claim 9, wherein the first voltage is a power supply voltage and the second voltage is a ground voltage.

15. The line defect detection circuit as claimed in claim 9, wherein the second drivers drive the corresponding lines using a third voltage to the ground voltage in response to the stress signal.

16. The line defect detection circuit as claimed in claim 15, wherein the first voltage is a boost voltage higher than a power supply voltage, the second voltage is the ground voltage, and the third voltage is the power supply voltage.

17. A line defect detection circuit, comprising:
a plurality of first drivers disposed on one terminal end of a plurality of lines, and each plurality of first drivers being configured to drive corresponding lines using a first voltage or a second voltage in response to a plurality of control signals, wherein each of the first drivers includes a PMOS transistor in which the control signal corresponding to each line is connected to a gate, the first voltage is connected to a source, and one end of the corresponding line is connected to a drain, and an NMOS transistor in which the corresponding control signal is connected to a gate, the second voltage is connected to a source, and one end of the corresponding line is connected to a drain;
a plurality of second drivers disposed on the other terminal end of each line, and each plurality of second drivers being configured to drive the corresponding lines using a third voltage to a ground voltage in response to a stress signal, wherein each of the second drivers includes a PMOS transistor or an NMOS transistor in which the stress signal is connected to a gate, the third voltage is connected to a source, and the other end of the corresponding line is connected to a drain; and
each of the control signals is sequentially activated in order to sequentially drive the lines.

* * * * *